United States Patent
Lim et al.

(10) Patent No.: US 8,482,119 B2
(45) Date of Patent: Jul. 9, 2013

(54) SEMICONDUCTOR CHIP ASSEMBLY

(75) Inventors: Fong Lim, Ayer Keroh (MY); See Yau Lee, Semabok (MY); Yang Hong Heng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 1105 days.

(21) Appl. No.: 12/213,754

(22) Filed: Jun. 24, 2008

(65) Prior Publication Data

US 2009/0315172 A1 Dec. 24, 2009

(51) Int. Cl.
*H01L 23/10* (2006.01)
*H01L 23/34* (2006.01)

(52) U.S. Cl.
USPC .......................... 257/707; 438/121

(58) Field of Classification Search
USPC ............... 257/704, 706, 707; 438/121, 122
See application file for complete search history.

(56) References Cited

U.S. PATENT DOCUMENTS

| | | | |
|---|---|---|---|
| 6,075,701 | A | 6/2000 | Ali et al. |
| 6,407,922 | B1 | 6/2002 | Eckblad et al. |
| 6,462,410 | B1 * | 10/2002 | Novotny et al. ............. 257/707 |
| 2003/0052405 | A1 | 3/2003 | Moriguchi |
| 2006/0055011 | A1 | 3/2006 | Carney et al. |
| 2006/0060891 | A1 | 3/2006 | Pavier |
| 2006/0266496 | A1 | 11/2006 | Edward et al. |
| 2007/0164424 | A1 * | 7/2007 | Dean et al. .................... 257/707 |

FOREIGN PATENT DOCUMENTS

DE 20 23 436 11/1970

* cited by examiner

*Primary Examiner* — Jenny L Wagner
(74) *Attorney, Agent, or Firm* — Dicke, Billig & Czaja, PLLC

(57) ABSTRACT

A semiconductor chip assembly includes a semiconductor chip and a pyrolytic graphite element that is an electrode that is electrically connected to and provides electrical conduction of current from the chip during operation of the chip.

18 Claims, 6 Drawing Sheets

SEMICONDUCTOR CHIP ASSEMBLY

FIELD OF THE INVENTION

The present invention generally relates a semiconductor chip assembly, and more particularly to a semiconductor chip assembly that includes a chip and a pyrolytic graphite element.

BACKGROUND OF THE INVENTION

Semiconductor chips include contact pads that are electrically connected to external circuitry in order to function as part of an electronic system. The external circuitry is typically a lead array such as lead frame or a support substrate such as a printed circuit board. Electrical connection between the chip and the external circuitry is often achieved by wire bonding, tape automated bonding (TAB) or flip-chip bonding. For instance, with flip-chip bonding, ball grid array (BGA) packages contain an array of solder balls to mount on corresponding terminals on a printed circuit board, and land grid array (LGA) packages contain an array of metal pads that receive corresponding solder traces mounted on corresponding terminals on a printed circuit board.

Semiconductor chips include power semiconductor devices such as power diodes (such as PN diodes and Schottky diodes) and power transistors (such as MOSFETs, JFETs, IGBTs, BJTs and thyristors). For instance, power MOSFETs have the power handling capability of bipolar transistors and the advantages of an isolated gate. As a result, power MOSFETs have almost completely replaced bipolar transistor in power applications.

Power semiconductor devices, however, generate large amounts of heat. Therefore, power semiconductor devices are usually attached to a heat sink to dissipate the heat to the external environment.

Heats sinks are usually thermally connected to chips by a packaging interface. Furthermore, heat sinks may also protect the chip from the external environment (moisture, dust, etc.)

Heat sinks are available in a wide variety of structures and materials. For instance, a copper case is thermally connected and mechanically attached to a chip by a die attach epoxy, and the copper case provides a heat sink as well as a protective lid for the chip. The copper case is exposed, or alternatively, the copper case contacts and is sandwiched between the die attach epoxy and an aluminum heat sink with vertically extending comb-like fins. However, copper has a thermal conductivity of 393.6 watts per meter-° K, and aluminum has a thermal conductivity of 218 watts per meter-° K. Although these thermal conductivities are relatively high compared to ceramic materials such as aluminum oxide, they are not high enough to provide optimal heat dissipation.

Therefore, there is a need for improved heat sinks for chips and power semiconductor devices that have high performance, high reliability, low thickness and low manufacturing cost.

SUMMARY

The present invention provides a semiconductor chip assembly that includes a semiconductor chip and a pyrolytic graphite element that is an electrode that is electrically connected to and provides electrical conduction of current from the chip during operation of the chip.

The present invention also provides a method of manufacturing a semiconductor chip assembly that includes providing a semiconductor chip, and then electrically connecting a pyrolytic graphite element to the chip to provide electrical conduction of current from the chip during operation of the chip.

These and other features and advantages of the present invention will become more apparent in view of the detailed description that follows.

BRIEF DESCRIPTION OF THE DRAWINGS

Preferred embodiments of the present invention will now be more fully described, with reference to the drawings in which.

DETAILED DESCRIPTION OF THE INVENTION

In the following description, the preferred embodiments of the present invention are described. It shall be apparent to those skilled in the art, however, that the present invention may be practiced without such details. Some of the details are not be described at length so as not to obscure the present invention.

Figure 1:
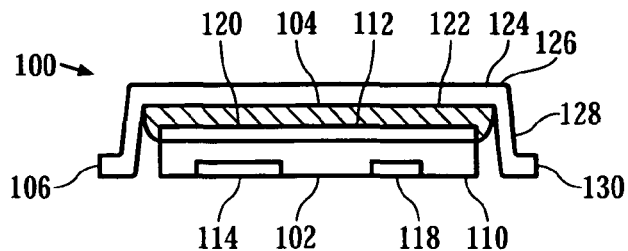
FIG. 1 is a cross-sectional view of a semiconductor chip assembly in accordance with a first embodiment.
Figure 2:
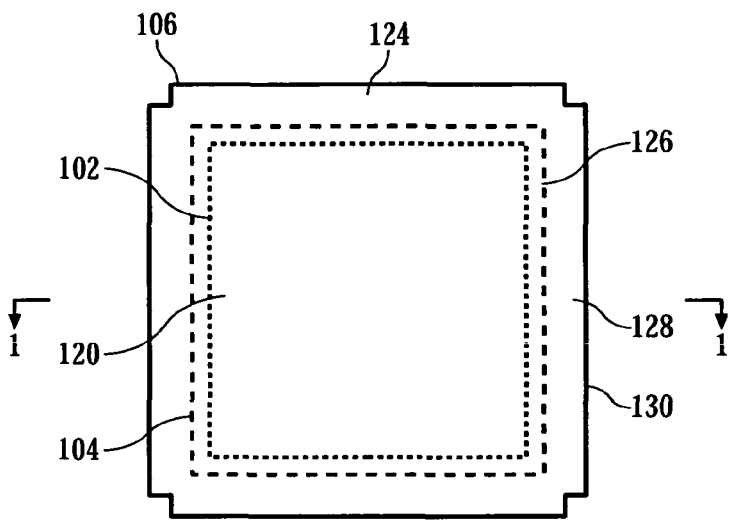
FIG. 2 is a top view of the semiconductor chip assembly of FIG. 1.
Figure 3:
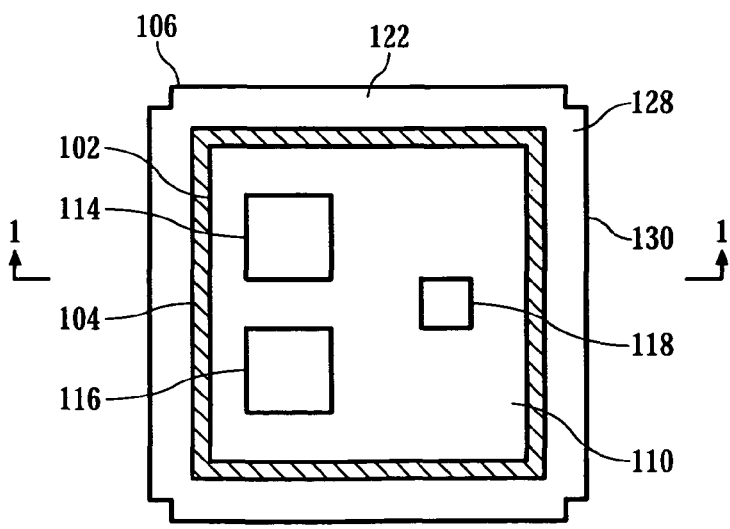
FIG. 3 is a bottom view of the semiconductor chip assembly of FIG. 1.

FIGS. 1, 2 and 3 are cross-sectional, top and bottom views, respectively, of semiconductor chip assembly 100 in accordance with a first embodiment.

Semiconductor chip assembly 100 includes semiconductor chip 102, adhesive 104 and pyrolytic graphite element 106.

Chip 102 is a power transistor that includes a source, a drain and a gate. Chip 102 is a high-current device that operates with high current density, high reverse breakdown voltage and high power dissipation and generates a large amount of heat.

Chip 102 includes opposing major surfaces 110 and 112, has a lateral surface area (length×width at surfaces 110 and 112) of 4.0×3.0 millimeters), and has a vertical thickness (between surfaces 110 and 112) of 0.25 millimeters. Chip 102 also includes contact pads 114, 116 and 118 at surface 110 and contact pad 120 at surface 112. Contact pads 114, 116 and 118 are within the periphery of surface 110, and contact pad 120 occupies the entire surface 112. Contact pads 114 and 116 are electrically connected to the source, contact pad 118 is electrically connected to the gate, and contact pad 120 is electrically connected to the drain. Thus, contact pads 114 and 116 are electrically connected to one another and electrically isolated from contact pads 118 and 120, and contact pads 118 and 120 are electrically isolated from one another. Furthermore, contact pads 114, 116 and 118 are substantially coplanar with one another and surface 110, and surfaces 110 and 112 and contact pads 114, 116, 118 and 120 are substantially flat.

Adhesive 104 is a die attach epoxy that is electrically and thermally conductive and has a thermal conductivity of 2.5 watts per meter-° K. Adhesive 104 contacts and is sandwiched between, is electrically and thermally connected to, and electrically and thermally connects and mechanically attaches chip 102 and pyrolytic graphite element 106.

Adhesive 104 has a lateral surface area (length×width at surface 122) of 4.5×3.5 millimeters, and has a vertical thickness (between surfaces 112 and 122) of 0.02 millimeters.

Pyrolytic graphite element 106 is a unitary, highly oriented pyrolytic graphite structure that is electrically and thermally conductive and has an in-plane (lateral) thermal conductivity of 1500 watts per meter-° K. Pyrolytic graphite element 106 is electrically and thermally connected to and mechanically attached to chip 102 by adhesive 104.

Pyrolytic graphite element 106 includes opposing major surfaces 122 and 124, has a lateral surface area (length×width at surfaces 122 and 124) of 6.7×5.7 millimeters, and has a vertical thickness (between surfaces 122 and 124) of 0.25 millimeters. Pyrolytic graphite element 104 also includes central region 126 and peripheral region 128. Central region 126 is flat and centrally located within peripheral region 128 and occupies most of the lateral surface area of pyrolytic graphite element 106, and peripheral region 128 is vertically bent and laterally surrounds central region 126 and includes four distal ends 130 at its four peripheral edges.

Pyrolytic graphite element 106 is spaced from chip 102 and thermally and electrically connected to chip 102 by adhesive 104. Pyrolytic graphite element 106 is thermally and electrically connected to the entire surface 112 of chip 102 by adhesive 104, and thus is electrically connected to contact pad 120 by adhesive 104.

Pyrolytic graphite element 106 is manufactured by chemical vapor deposition (CVD) of carbon onto a mold with the desired shape, post processing the carbon to provide pyrolytic graphite, removing the pyrolytic graphite from the mold, and then singulating pyrolytic graphite element 106 from other pyrolytic graphite elements that are simultaneously batch manufactured. Preferably, pyrolytic graphite element 106 is thick enough (e.g., 0.25 millimeters) to have a thermal conductivity of 1500 watts per meter-° K. Alternatively, pyrolytic graphite element 106 can be thinner (e.g., 0.10 millimeters) and have a thermal conductivity of 700 watts per meter-° K to reduce cost. As another alternative, pyrolytic graphite element 106 can have a thermal conductivity of 1700 to 1750 watts per meter-° K. In any case, pyrolytic graphite element 106 has substantially higher thermal conductivity than conventional heat sink metals such as copper, aluminum, silver and alloys thereof.

Chip 102 is centrally located within and vertically aligned with adhesive 104 and central region 126. Surface 110 faces away from adhesive 104 and pyrolytic graphite element 106, and surface 112 faces towards adhesive 104 and pyrolytic graphite element 106. Adhesive 104 contacts and covers and is vertically aligned with central region 126 and is spaced from peripheral region 128. Surface 122 faces towards chip 102 and adhesive 104, and surface 124 faces away from chip 102 and adhesive 104. In addition, distal ends 130 are substantially coplanar with surface 110 and contact pads 114, 116 and 118.

Pyrolytic graphite element 106 provides an electrode that is electrically connected to and provides electrical conduction of current from contact pad 120 during operation of chip 102. Thus, pyrolytic graphite element 106 provides a drain electrode for chip 102. It is understood that electrical conduction of current from contact pad 120 includes current that flows in any direction.

Pyrolytic graphite element 106 also provides a heat sink that is thermally connected to and provides thermal conduction of heat from chip 102 during operation of chip 102. The heat generated by chip 102 flows vertically from surface 112 through adhesive 104 to central region 126, and then flows laterally (in-plane) from central region 126 to peripheral region 128 and is dissipated into the external environment at distal ends 130. Thus, pyrolytic graphite element 106 provides a high thermal transfer rate that redistributes concentrations of the heat and conducts the heat away from chip 102.

Pyrolytic graphite element 106 also provides a case that vertically covers and laterally surrounds chip 102, protects chip 102 from the external environment and is exposed to the external environment. Central region 126 vertically covers chip 102 and adhesive 104, and peripheral region 128 laterally surrounds and vertically extends across the thickness of chip 102 and adhesive 104. In addition, surface 122 is mostly unexposed and surface 124 is entirely exposed. In particular, central region 126 at surface 122 is unexposed, and peripheral region 128 at surface 122 is entirely exposed. It is understood that the case is functionally equivalent to a can, lid or cover.

Semiconductor chip assembly 100 is a compact, robust, single-chip, first-level semiconductor package that consists of semiconductor chip 102, adhesive 104 and pyrolytic graphite element 106. Advantageously, pyrolytic graphite element 106 provides not only an electrode for electrical conduction of drain current from chip 102, but also a heat sink for thermal conduction of heat from chip 102 as well as a protective case that vertically covers and laterally surrounds chip 102.

Figure 4:
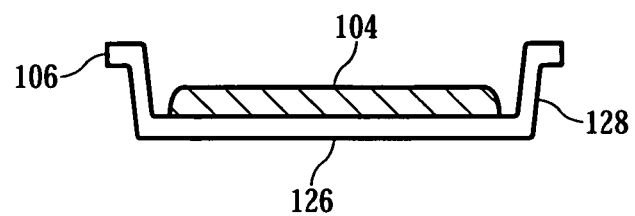
FIGS. 4, 5 and 6 are cross-sectional views of a method of making the semiconductor chip assembly of FIG. 1.
Figure 5:
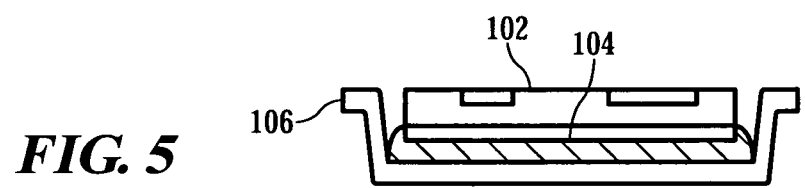
Figure 6:
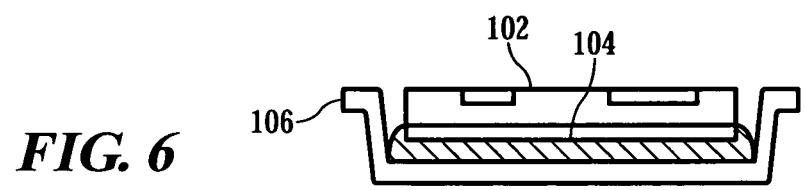

FIGS. 4, 5 and 6 are cross-sectional views of a method of making semiconductor chip assembly 100.

In FIG. 4, adhesive 104 is deposited as uncured epoxy (A stage) on pyrolytic graphite element 106 along central region 126 at surface 122 using stencil printing. During stencil printing, a stencil (not shown) is placed on pyrolytic graphite element 106, a stencil opening is aligned with central region 126 and offset from peripheral region 128, and then a squeegee (not shown) pushes the uncured epoxy along the surface of the stencil opposite pyrolytic graphite element 106, through the stencil opening and onto pyrolytic graphite element 106. The uncured epoxy is compliant enough at room temperature to conform to virtually any shape.

In FIG. 5, chip 102 is placed on adhesive 104 (which is still uncured epoxy) using a pick-up head (not shown) that applies low pressure, briefly holds chip 102 within adhesive 104 and then releases chip 102. The pick-up head is heated to a relatively low temperature such as 150° C. so that adhesive 104 is partially polymerized (B stage) and forms a gel but is not cured. Thus, adhesive 104 electrically and thermally connects and loosely mechanically attaches chip 102 and pyrolytic graphite element 106.

In FIG. 6, adhesive 104 is heated to a relatively low but slightly higher temperature such as 250° C. to convert the uncured epoxy into cured epoxy (C stage) that rigidly mechanically attaches chip 102 and pyrolytic graphite element 106.

Figure 7:
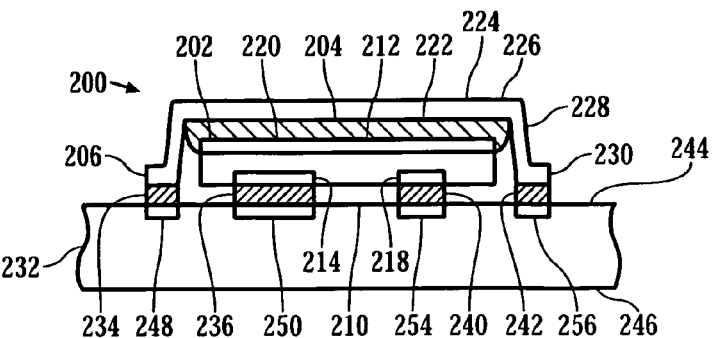
FIG. 7 is a cross-sectional view of a semiconductor chip assembly in accordance with a second embodiment.
Figure 8:
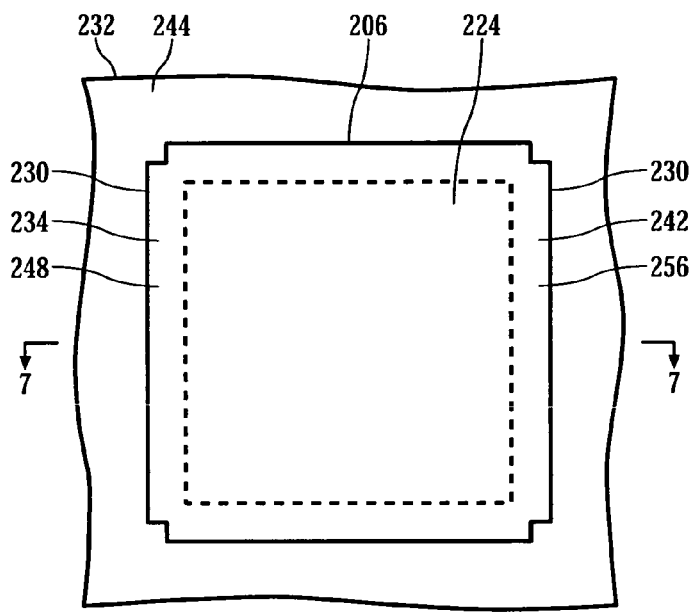
FIG. 8 is a top view of the semiconductor chip assembly of FIG. 7.
Figure 9:
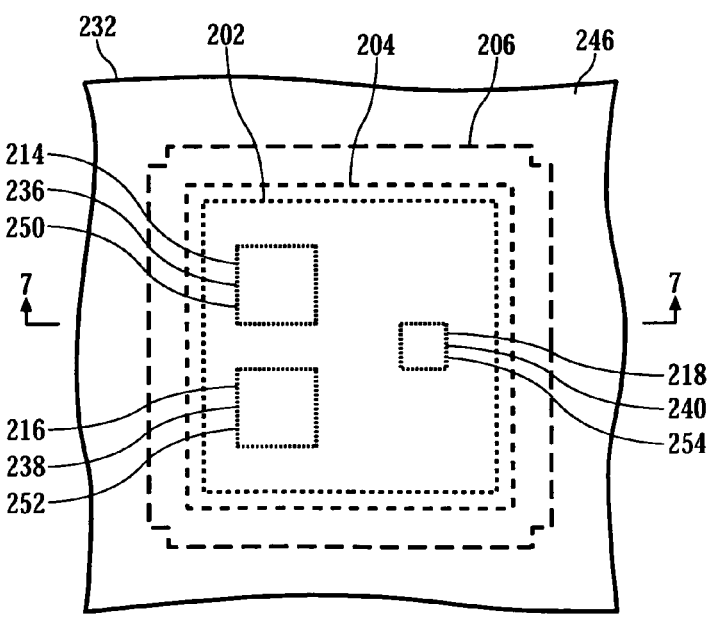
FIG. 9 is a bottom view of the semiconductor chip assembly of FIG. 7.

FIGS. 7, 8 and 9 are cross-sectional, top and bottom views, respectively, of semiconductor chip assembly 200 in accordance with a second embodiment.

Semiconductor chip assembly 200 includes chip 202, adhesive 204 and pyrolytic graphite element 206 which are identical to chip 102, adhesive 104 and pyrolytic graphite element 106, respectively. Chip 202 includes surfaces 210 and 212, contact pads 214, 216 and 218 at surface 210 and contact pad 220 at surface 212. Pyrolytic graphite element 206 includes surfaces 222 and 224, central region 226, peripheral region 228 and distal ends 230.

Semiconductor chip assembly 200 also includes printed circuit board 232 and solder joints 234, 236, 238, 240 and 242.

Printed circuit board 232 is a multi-layer interconnect substrate that electrically connects and mechanically supports numerous chips (including chip 202).

Printed circuit board 232 includes opposing major surfaces 244 and 246 and terminals 248, 250, 252, 254 and 256 at surface 244. Terminals 248 and 256 are electrically connected to pyrolytic graphite element 206 and thus the drain, terminal 250 is electrically connected to contact pad 214 and thus the source, terminal 252 is electrically connected to contact pad 216 and thus the source, and terminal 254 is electrically connected to contact pad 218 and thus the gate. Thus, terminals 248 and 256 are electrically connected to one another and electrically isolated from terminals 250, 252 and 254, and terminals 250 and 252 are electrically connected to one another and electrically isolated from terminal 254. Furthermore, terminals 248, 250, 252, 254 and 256 are substantially coplanar with one another and surface 244.

Solder joints 234, 236, 238, 240 and 242 are electrically and thermally conductive and have a thermal conductivity of 60 watts per meter-° K. Solder joints 234, 236, 238, 240 and 242 contact and are sandwiched between, are electrically and thermally connected to, and electrically and thermally connect and mechanically attach pyrolytic graphite element 206, contact pad 214, contact pad 216, contact pad 218 and pyrolytic graphite element 206, respectively, to terminals 248, 250, 252, 254 and 256, respectively. Thus, solder joint 234 transfers an electrical signal between contact pad 220 and terminal 248, solder joint 236 transfers an electrical signal between contact pad 214 and terminal 250, solder joint 238 transfers an electrical signal between contact pad 216 and terminal 252, solder joint 240 transfers an electrical signal between contact pad 218 and terminal 254, and solder joint 242 transfers an electrical signal between contact pad 220 and terminal 256 during operation of chip 202.

Solder joints 234, 236, 238, 240 and 242 have lateral surface areas that correspond to terminals 248, 250, 252, 254 and 256, respectively, and a vertical thickness (between surfaces 210 and 244 and between surfaces 224 and 244) of 50 millimeters.

Semiconductor chip assembly 200 is second-level electronics module in which semiconductor chip assembly 100 (depicted by chip 202, adhesive 204 and pyrolytic graphite element 206) is mounted on printed circuit board 232 by solder joints 234, 236, 238, 240 and 242, and other first-level semiconductor chip assemblies (not shown) are also mounted on printed circuit board 232 by other solder joints (not shown) placed on corresponding terminals (not shown).

Figure 10:
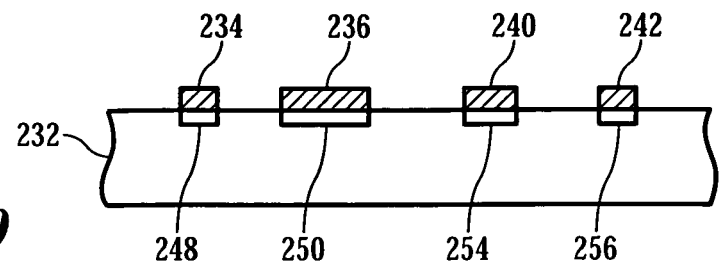
FIGS. 10, 11 and 12 are cross-sectional views of a method of making the semiconductor chip assembly of FIG. 7.
Figure 11:
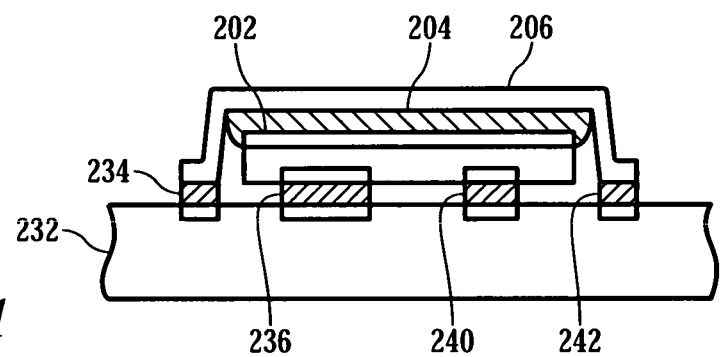
Figure 12:
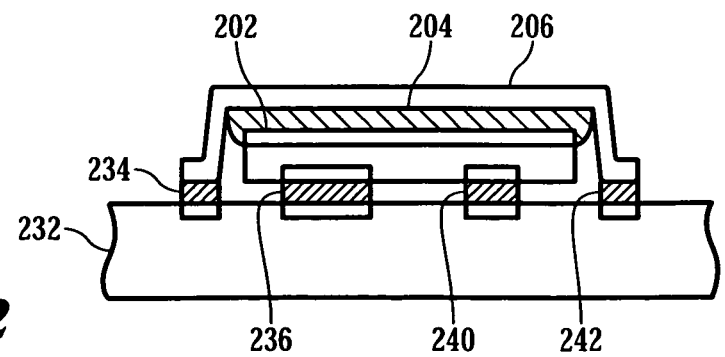
Figure 13:
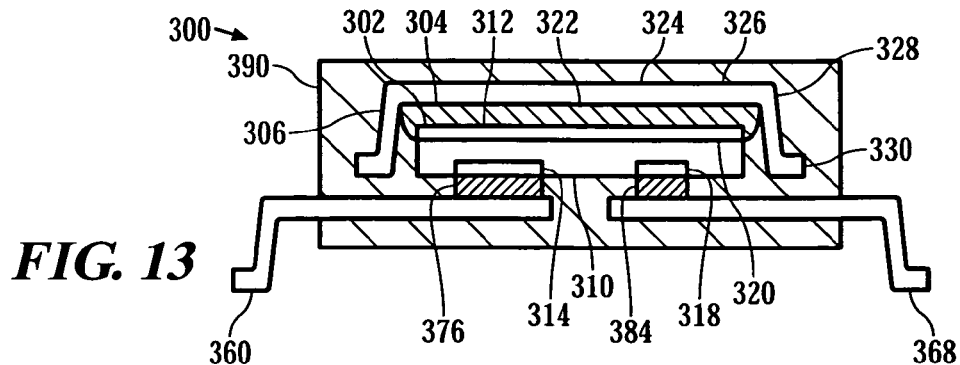
FIG. 13 is a cross-sectional view of a semiconductor chip assembly in accordance with a third embodiment.
Figure 14:
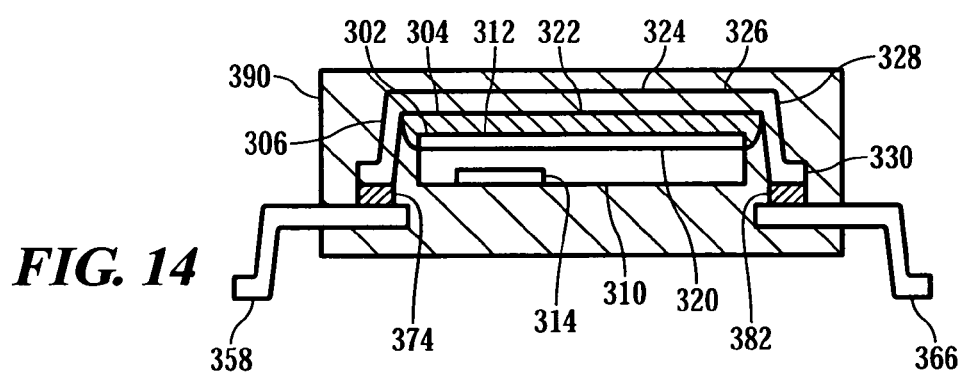
FIG. 14 is a cross-sectional view of the semiconductor chip assembly of FIG. 13.
Figure 15:
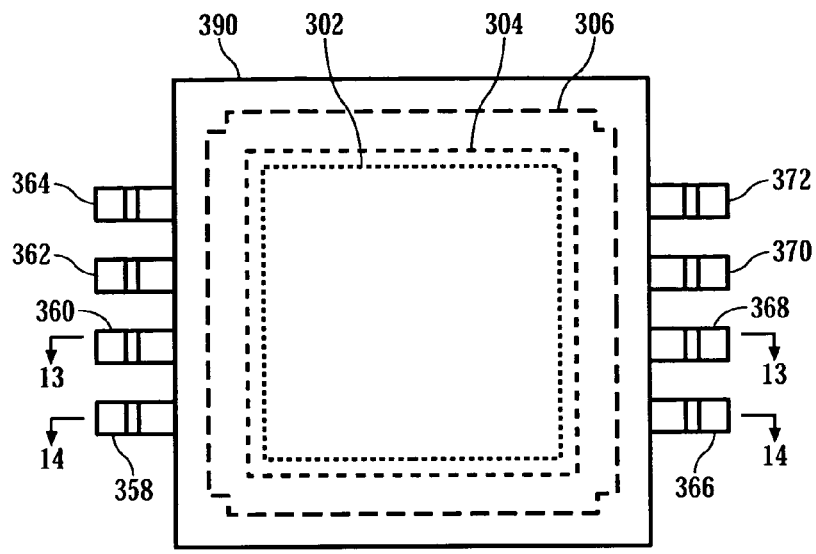
FIG. 15 is a top view of the semiconductor chip assembly of FIG. 13.
Figure 16:
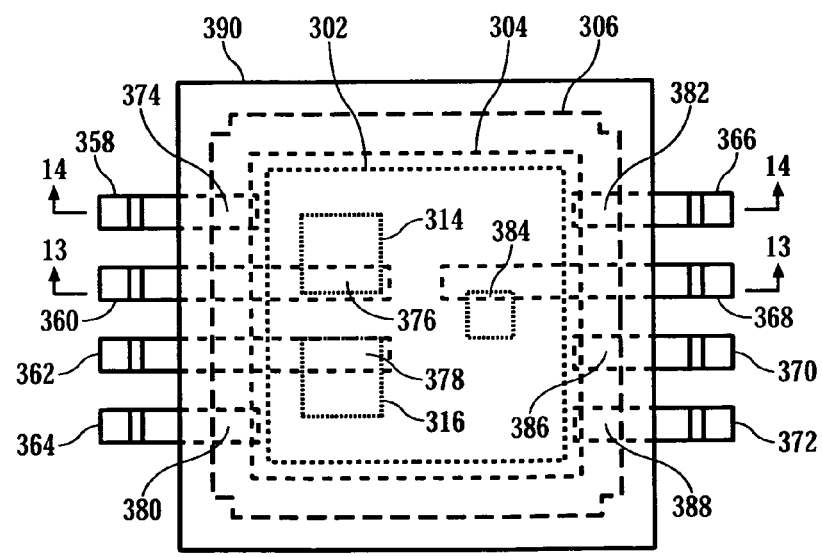
FIG. 16 is a bottom view of the semiconductor chip assembly of FIG. 13.

FIGS. 10, 11 and 12 are cross-sectional views of a method of making semiconductor chip assembly 200.

In FIG. 10, solder joints 234, 236, 238, 240 and 242 are deposited as solder paste on terminals 248, 250, 252, 254 and 256, respectively, using stencil printing. During stencil printing, a stencil (not shown) is placed on printed circuit board 232, stencil openings are aligned with terminals 248, 250, 252, 254 and 256, and then a squeegee (not shown) pushes the solder paste along the surface of the stencil opposite printed circuit board 232, through the stencil openings and onto printed circuit board 232. The solder paste includes finely powdered tin-silver-copper solder particles mixed in a viscous organic resin containing a fluxing agent and is compliant enough at room temperature to conform to virtually any shape.

In FIG. 11, chip 202, adhesive 204 and pyrolytic graphite element 206 (semiconductor chip assembly 100) are placed on solder joints 234, 236, 238, 240 and 242 (which are still solder paste) using a pick-up head (not shown) that applies low pressure, briefly holds the structure within the solder paste and then releases the structure. Thus, solder joints 234, 236, 238, 240 and 242 electrically and thermally connect and loosely mechanically attach chip 202, adhesive 204 and pyrolytic graphite element 206 to printed circuit board 232.

In FIG. 12, solder joints 234, 236, 238, 240 and 242 are heated to a relatively low temperature such as 250° C. to convert the solder paste into hardened solder links that rigidly mechanically attach chip 202, adhesive 204 and pyrolytic graphite element 206 to printed circuit board 232.

FIGS. 13, 14, 15 and 16 are cross-sectional, cross-sectional, top and bottom views, respectively, of semiconductor chip assembly 300 in accordance with a third embodiment.

Semiconductor chip assembly 300 includes chip 302, adhesive 304 and pyrolytic graphite element 306 which are identical to chip 102, adhesive 104 and pyrolytic graphite element 106, respectively. Chip 302 includes surfaces 310 and 312, contact pads 314, 316 and 318 at surface 310 and contact pad 320 at surface 312. Pyrolytic graphite element 306 includes surfaces 322 and 324, central region 326, peripheral region 328 and distal ends 330, is unexposed and provides a clip.

Semiconductor chip assembly 300 also includes leads 358, 360, 362, 364, 366, 368, 370 and 372, solder joints 374, 376, 378, 380, 382, 384, 386 and 388 and encapsulant 390.

Leads 358, 360, 362, 364, 366, 368, 370 and 372 are silver-plated copper. Leads 358, 364, 366, 370 and 372 are electrically connected to pyrolytic graphite element 306 and thus the drain, lead 360 is electrically connected to contact pad 314 and thus the source, lead 362 is electrically connected to contact pad 316 and thus the source, and lead 368 is electrically connected to contact pad 318 and thus the gate. Thus, leads 358, 364, 366, 370 and 372 are electrically connected to one another and electrically isolated from leads 360, 362, 368, and leads 360 and 362 are electrically connected to one another and electrically isolated from lead 368. Furthermore, leads 358, 360, 362, 364, 366, 368, 370 and 372 have identical widths and thickness and are substantially coplanar at their inner and outer distal ends Solder joints 374, 376, 378, 380, 382, 384, 386 and 388 are electrically and thermally conductive and have a thermal conductivity of 60 watts per meter-° K. Solder joints 374, 376, 378, 380, 382, 384, 386 and 388 contact and are sandwiched between, are electrically and thermally connected to, and electrically and thermally connect and mechanically attach pyrolytic graphite element 306, contact pad 314, contact pad 316, pyrolytic graphite element 306, pyrolytic graphite element 306, contact pad 320, pyrolytic graphite element 306 and pyrolytic graphite element 306, respectively, to leads 358, 360, 362, 364, 366, 368, 370 and 372, respectively. Thus, solder joint 374 transfers an electrical signal between contact pad 320 and lead 358, solder joint 376 transfers an electrical signal between contact pad 314 and lead 360, solder joint 378 transfers an electrical signal between contact pad 316 and lead 362, solder joint 380 transfers an electrical signal between contact pad 320 and lead 364, solder joint 382 transfers an electrical signal between contact pad 320 and lead 366, solder joint 384 transfers an electrical signal between contact pad 318 and lead 368, solder joint 386 transfers an electrical signal between contact pad 320 and lead 370, and solder joint 388 transfers an electrical signal between contact pad 320 and lead 372 during operation of chip 302.

Encapsulant 390 is a molded plastic that is electrically insulative and thermally conductive and contacts, surrounds and protects and protects chip 302, adhesive 304, pyrolytic graphite element 306 and solder joints 374, 376, 378, 380, 382, 384, 386 and 388. Leads 358, 360, 362, 364, 366, 368, 370 and 372 protrude from encapsulant 390 and are exposed at their outer distal ends and unexposed at their inner distal ends.

The above description and examples illustrate the preferred embodiments of the present invention, and it will be appreciated that various modifications and improvements can be made without departing from the scope of the present invention.

The invention claimed is:

1. A semiconductor chip assembly, comprising:
a semiconductor chip;
a pyrolytic graphite element electrically connected to and providing electrical conduction of current from the chip and providing thermal conduction from the chip in a high thermal conductivity direction during operation of the chip; and
an electrically and thermally conductive adhesive that contacts and is sandwiched between the semiconductor chip and the pyrolytic graphite element, the adhesive cured by heating to rigidly mechanically attach the chip and pyrolytic graphite element so that current and heat between the pyrolytic graphite element and the chip is transferred during operation of the chip.

2. The semiconductor chip assembly of claim 1, wherein:
the chip includes first and second opposing major surfaces, the first surface of the chip includes a contact pad and faces away from the pyrolytic graphite element, and the second surface of the chip faces towards the pyrolytic graphite element; and
the pyrolytic graphite element includes a lateral in-plane region having a high thermal conductivity, the pyrolytic graphite element providing the thermal conduction in the high thermal conductivity direction through the lateral in-plane region.

3. The semiconductor chip assembly of claim 2, wherein the pyrolytic graphite element is a case that covers and protects the chip and is exposed.

4. A semiconductor chip assembly, comprising:
a semiconductor chip that includes first and second opposing major surfaces, wherein the first surface of the chip includes a first contact pad and the second surface of the chip includes a second contact pad;
a printed circuit board that includes first and second terminals;
a pyrolytic graphite element electrically and thermally connected to and provides electrical conduction of current between the second contact pad and the second terminal during operation of the chip, and provides thermal conduction of heat from the second surface of the chip during operation of the chip; and
an electrically and thermally conductive adhesive that contacts and is sandwiched between the second contact pad of the semiconductor chip and the pyrolytic graphite element, the adhesive cured by heating to rigidly mechanically attach the chip and pyrolytic graphite element so that current and heat between the pyrolytic graphite element and the second surface of the chip is transferred during operation of the chip.

5. The semiconductor chip assembly of claim 4, including:
a first solder joint that contacts and is sandwiched between and transfers an electrical signal between the first contact pad and the first terminal during operation of the chip; and
a second solder joint that contacts and is sandwiched between and transfers the current between the pyrolytic graphite element and the second terminal during operation of the chip, wherein the first and second solder joints are electrically isolated from one another.

6. The semiconductor chip assembly of claim 5, wherein:
the chip is disposed between the printed circuit board and the pyrolytic graphite element, the first surface of the chip faces towards the printed circuit board and faces away from the pyrolytic graphite element, and the second surface of the chip faces towards the pyrolytic graphite element and faces away from the printed circuit board; and
the pyrolytic graphite element is a case that covers and protects the chip, is exposed, extends across a thickness of the chip between the first and second surfaces of the chip and includes a distal end that is spaced from and substantially coplanar with and laterally surrounds the first surface of the chip and contacts the second solder joint.

7. The semiconductor chip assembly of claim 6, wherein the pyrolytic graphite element includes first and second opposing major surfaces, the first surface of the pyrolytic graphite element faces towards the chip and the printed circuit board and is mostly or entirely unexposed, and the second surface of the pyrolytic graphite element faces away from the chip and the printed circuit board and is mostly or entirely exposed.

8. A semiconductor chip assembly, comprising:
a semiconductor chip that includes first and second opposing major surfaces, wherein the first surface of the chip includes a contact pad;
pyrolytic graphite means for electrical conduction of current from the second surface of the chip during operation of the chip, and for thermal conduction of heat from the second surface of the chip during operation of the chip; and
adhesive means that contacts and is sandwiched between the pyrolytic graphite means and the second surface of the chip, the adhesive means cured by heating to rigidly mechanically attach the chip and the pyrolytic graphite means so that current and heat between the pyrolytic graphite means and the second surface of the chip is transferred during operation of the chip.

9. The semiconductor chip assembly of claim 8, wherein the pyrolytic graphite means is a case that covers and protects the chip and is exposed.

10. The semiconductor chip assembly of claim 8, wherein the pyrolytic graphite means includes first and second opposing major surfaces, the first surface of the pyrolytic graphite means faces towards the chip and is mostly or entirely unexposed, and the second surface of the pyrolytic graphite means faces away from the chip and is mostly or entirely exposed.

11. The semiconductor chip assembly of claim 8, including:
a printed circuit board that includes first and second terminals;

first electrical connection means that contacts and is sandwiched between and transfers an electrical signal between the contact pad and the first terminal during operation of the chip; and second electrical connection means that contacts and is sandwiched between and transfers the current between the pyrolytic graphite means and the second terminal during operation of the chip, wherein the first and second electrical connection means are electrically isolated from one another.

12. A method of manufacturing a semiconductor chip assembly, comprising:

providing a semiconductor chip;

providing an electrically and thermally conductive epoxy in an uncured stage in contact with and sandwiched between the chip and a pyrolytic graphite element, thereby loosely attaching the chip and the pyrolytic graphite element; and then curing the epoxy, thereby rigidly attaching the chip and the pyrolytic graphite element; and electrically and thermally connecting the pyrolytic graphite element to the chip to provide electrical conduction of current from the chip and to provide thermal conduction from the chip during operation of the chip, the thermal conduction being provided in a lateral in-plane region of the pyrolytic graphite element having a high thermal conductivity.

13. The method of claim 12, including electrically and thermally connecting the pyrolytic graphite element to the chip while the pyrolytic graphite element is exposed.

14. The method of claim 12, including electrically and thermally connecting the pyrolytic graphite element to the chip using an adhesive while the assembly consists of the chip, the adhesive and the pyrolytic graphite element.

15. A method of manufacturing a semiconductor chip assembly, comprising:

providing a semiconductor chip that includes first and second opposing major surfaces, wherein the first surface of the chip includes a first contact pad that transfers a first electrical signal during operation of the chip and the second surface of the chip includes a second contact pad that transfers a second electrical signal during operation of the chip; then providing an electrically and thermally conductive epoxy in an uncured stage in contact with and sandwiched between the second contact pad of the chip and a pyrolytic graphite element, thereby loosely attaching the chip and the pyrolytic graphite element; and then curing the epoxy, thereby rigidly attaching the chip and the pyrolytic graphite element;

electrically connecting the pyrolytic graphite element to the second contact pad to provide electrical conduction of the second electrical signal from the second contact pad during operation of the chip; and thermally connecting the pyrolytic graphite element to the second surface of the chip to provide thermal conduction of heat from the second surface of the chip during operation of the chip.

16. The method of claim 15, including electrically and thermally connecting the pyrolytic graphite element to the chip while the pyrolytic graphite element is exposed.

17. The method of claim 15, including electrically and thermally connecting the pyrolytic graphite element to the chip using an adhesive while the assembly consists of the chip, the adhesive and the pyrolytic graphite element.

18. The method of claim 15, including:

electrically and thermally connecting the pyrolytic graphite element to the chip; then mounting the pyrolytic graphite element and the chip on a printed circuit board that includes first and second terminals while the pyrolytic graphite element is exposed;

electrically connecting the first contact pad to the first terminal to transfer the first electrical signal between the first contact pad and the first terminal during operation of the chip; and electrically connecting the pyrolytic graphite element to the second terminal to transfer the second electrical signal between the second contact pad and the second terminal during operation of the chip.

* * * * *